(12) United States Patent
Huang et al.

(10) Patent No.: US 12,323,194 B2
(45) Date of Patent: Jun. 3, 2025

(54) MEASURING SYSTEM AND ASSOCIATED METHOD

(71) Applicant: REALTEK SEMICONDUCTOR CORPORATION, Hsinchu (TW)

(72) Inventors: Ming-Chung Huang, Hsinchu (TW); Hsiang-Chen Kuo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 401 days.

(21) Appl. No.: 18/061,808

(22) Filed: Dec. 5, 2022

(65) Prior Publication Data

US 2023/0188228 A1 Jun. 15, 2023

(30) Foreign Application Priority Data

Dec. 14, 2021 (TW) ................. 110146686

(51) Int. Cl.
*H04B 17/29* (2015.01)
*H03F 3/24* (2006.01)

(52) U.S. Cl.
CPC ............... *H04B 17/29* (2015.01); *H03F 3/24* (2013.01)

(58) Field of Classification Search
CPC .................................. H04B 17/29; H03F 3/24
USPC ...................................................... 455/67.11
See application file for complete search history.

(56) References Cited

U.S. PATENT DOCUMENTS

| | | | | |
|---|---|---|---|---|
| 10,116,264 B1* | 10/2018 | Gutman | ..................... | H03F 3/19 |
| 10,298,185 B2* | 5/2019 | Gutman | ..................... | H03F 3/68 |
| 10,530,315 B2* | 1/2020 | Gutman | ................ | H03F 1/0261 |
| 10,887,079 B1* | 1/2021 | Geron | ................... | H03F 1/3247 |
| 11,374,615 B1* | 6/2022 | Tam | ....................... | H04B 17/12 |
| 2003/0071684 A1* | 4/2003 | Noori | ..................... | H03F 1/3258 330/149 |
| 2007/0222512 A1* | 9/2007 | Krishnamurthy | ..... | H03F 1/0266 330/149 |
| 2009/0072901 A1* | 3/2009 | Yamanouchi | ......... | H03F 1/3223 330/149 |
| 2010/0039174 A1* | 2/2010 | Teetzel | .................. | H03F 1/3211 330/149 |
| 2010/0225389 A1* | 9/2010 | Teetzel | .................... | H03F 3/211 330/149 |
| 2011/0068865 A1* | 3/2011 | Mohamadi | ............... | H01P 5/20 330/149 |

(Continued)

*Primary Examiner* — April G Gonzales
(74) *Attorney, Agent, or Firm* — WPAT, P.C.; Anthony King

(57) ABSTRACT

The application discloses a measuring system and associated method for measuring phases of IMD3 signals generated from a power amplifier. The method includes: performing a phase estimation process, including a plurality of sub-processes, wherein each sub-process includes: generating a first main signal, a second main signal, a first adjustable signal, wherein frequencies of the first main signal, the second main signal, the first adjustable signal are f1, f2, 2f1-f2; and correspondingly measuring a first power at frequency of 2f1-f2; and estimating a phase of the IMD3 signal at frequency of 2f1-f2 caused by the first main signal and the second main signal passing through the power amplifier according to a plurality of first powers obtained from the plurality of sub-processes; wherein in each sub-process, a phase of the first adjustable signal is different from that of other sub-processes.

20 Claims, 6 Drawing Sheets

(56) References Cited

U.S. PATENT DOCUMENTS

| | | | |
|---|---|---|---|
| 2016/0095055 A1* | 3/2016 | Sarrigeorgidis | H04B 1/525 |
| | | | 370/311 |
| 2017/0195005 A1* | 7/2017 | Heinikoski | H03F 1/3247 |
| 2018/0351512 A1* | 12/2018 | Gutman | H03F 3/19 |
| 2019/0245495 A1* | 8/2019 | Gutman | H04B 17/13 |
| 2021/0036664 A1* | 2/2021 | Mao | H03F 3/193 |
| 2021/0218423 A1* | 7/2021 | Barton | H04B 1/0458 |
| 2023/0139103 A1* | 5/2023 | Kayahan | H04B 17/14 |
| | | | 455/78 |

* cited by examiner

MEASURING SYSTEM AND ASSOCIATED METHOD

CROSS-REFERENCE TO RELATED APPLICATIONS

This application claims priority of Taiwan application No. 110146686 filed on Dec. 14, 2021, which is incorporated by reference in its entirety.

TECHNICAL FIELD

The present application relates to a system, particularly to a measuring system and an associated method.

BACKGROUND

When the output power of a power amplifier is close to the saturated output power, the distortion will be aggravated and an inter-modulation distortion (IMD) signal will be generated at the output terminal, resulting in a lower signal-to-noise ratio and possibly making the system incompliant to the regulations because the IMD signal may occupy the frequency band of other users. The conventional practice is to measure the power amplifier after it has been integrated into the system and use the system for calibration, but this will increase the overall system cost.

SUMMARY OF THE INVENTION

The present application provides a measuring system, configured to measure a phase of an IMD3 signal generated by a power amplifier, the system including: a signal generator, coupled to an input terminal of the power amplifier; a spectrum analyzer, coupled to an output terminal of the power amplifier; and a controller, configured to perform phases estimation process, including a plurality of sub-processes, wherein each sub-process includes: controlling the signal generator to generate a first main signal, a second main signal, a first adjustable signal, wherein a frequency of each of the first main signal, the second main signal, the first adjustable signal is f1, f2, and 2f1-f2; and controlling the spectrum analyzer to correspondingly measure a first power at the frequency of 2f1-f2; wherein the power of the first adjustable signal in each sub-process is the same as that in any other sub-processes, but the phase of the first adjustable signal in each sub-process is different from that of any other sub-processes, the phase and power of the first main signal in each sub-process are the same as that in any other sub-processes, the phase and power of the second main signal in each sub-process are the same as that in any other sub-processes, and the controller estimates the phase of the IMD3 signal generated at the frequency of 2f1-f2 by the first main signal and the second main signal passing through the power amplifier based on a plurality of first powers obtained by the plurality of sub-processes.

The present application provides a measuring method, configured to measure a phase of an IMD3 signal generated by a power amplifier, the method including: performing a phases estimation process, including a plurality of sub-processes, wherein each sub-process includes: generating a first main signal, a second main signal, a first adjustable signal, wherein a frequency of each of the first main signal, the second main signal, the first adjustable signal is f1, f2, and 2f1-f2; and correspondingly measuring a first power at the frequency of 2f1-f2; and estimating the phase of the IMD3 signal generated at the frequency of 2f1-f2 by the first main signal and the second main signal passing through the power amplifier based on a plurality of first powers obtained by the plurality of sub-processes; wherein a power of the first adjustable signal in each sub-process is the same as that in any other sub-processes, but the phase of the first adjustable signal in each sub-process is different from that of any other sub-processes, the phase and power of the first main signal in each sub-process are the same as that in any other sub-processes, and the phase and power of the second main signal in each sub-process are the same as that in any other sub-processes.

The method of the present application can determine the characteristics of the power amplifier at an early stage, saving the measurement of the power amplifier after it has been integrated into the system, so as to reduce the cost.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
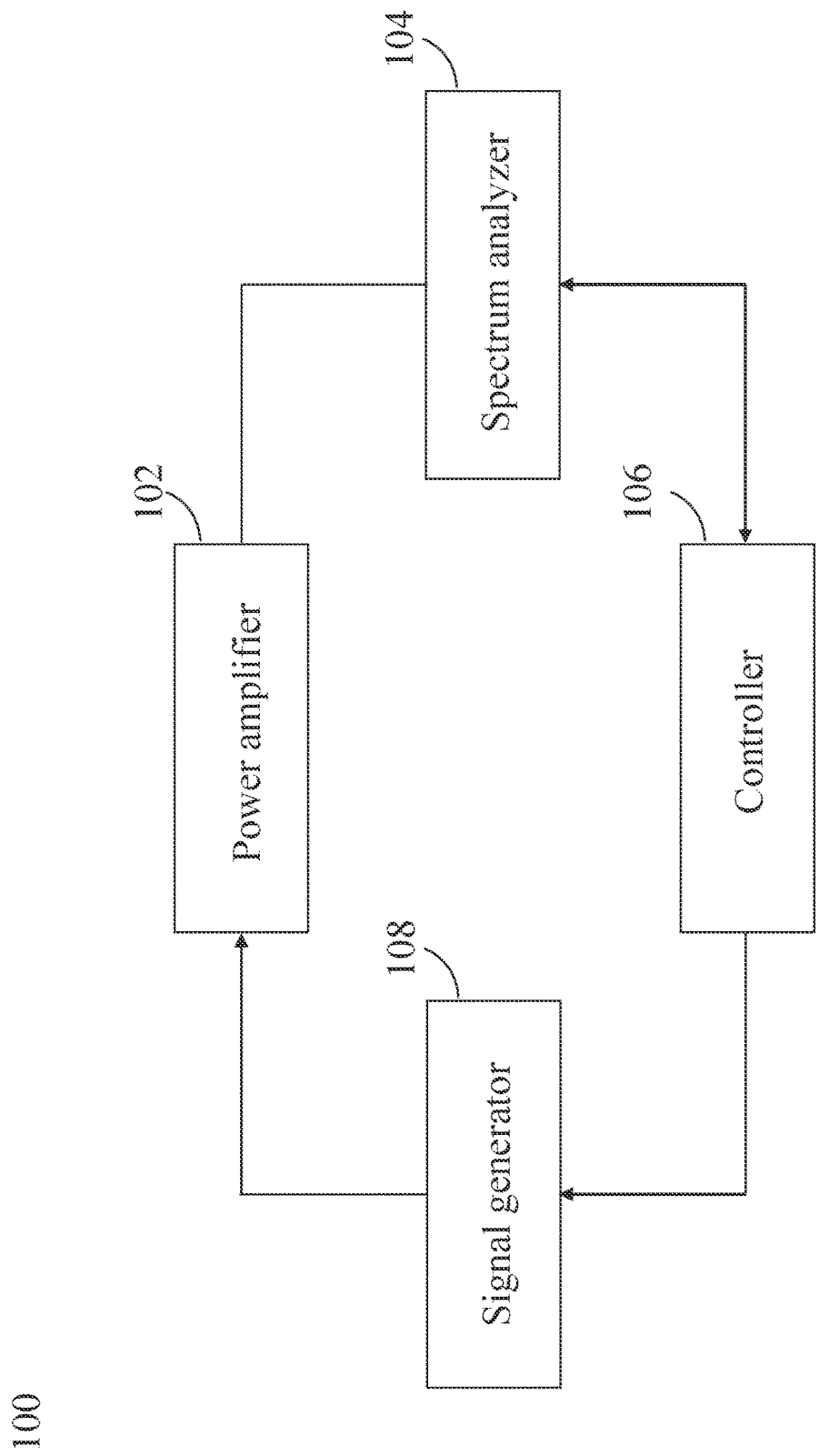
FIG. 1 is a schematic diagram illustrating a measuring system according to embodiments of the present disclosure.

FIG. 1 is a schematic diagram illustrating a measuring system 100 according to embodiments of the present disclosure; the measuring system 100 is configured to measure a phase of an IMD3 signal generated by a power amplifier 102. A signal generator 108 is coupled to an input terminal of the power amplifier 102; a spectrum analyzer 104 is coupled to an output terminal of the power amplifier 102. A controller 106 is configured to control the signal generator 108 and the spectrum analyzer 104 to perform a phases estimation process. In the present embodiment, the controller 106 may be implementing using a firmware or software, in connection with a processor.

Figure 2:
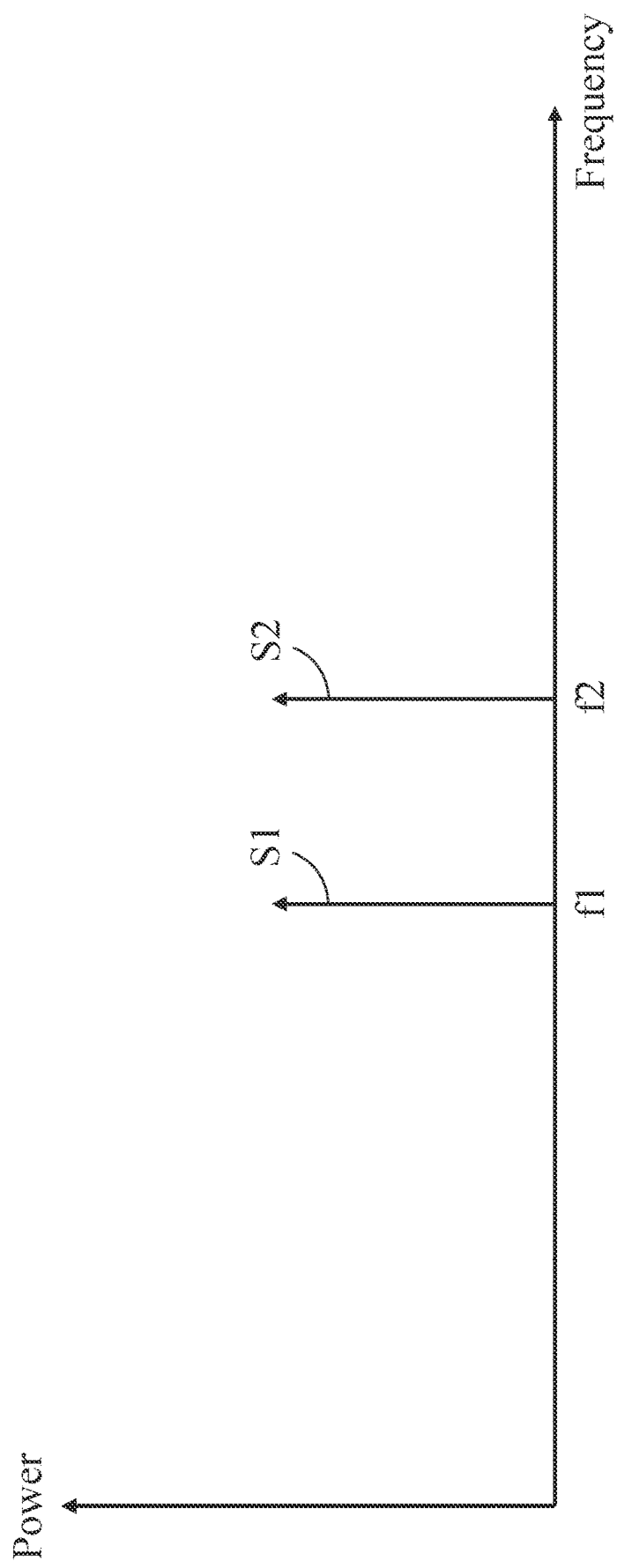
FIG. 2 is a schematic diagram illustrating a main signal S1 and a main signal S2 in the spectrum.
Figure 3:
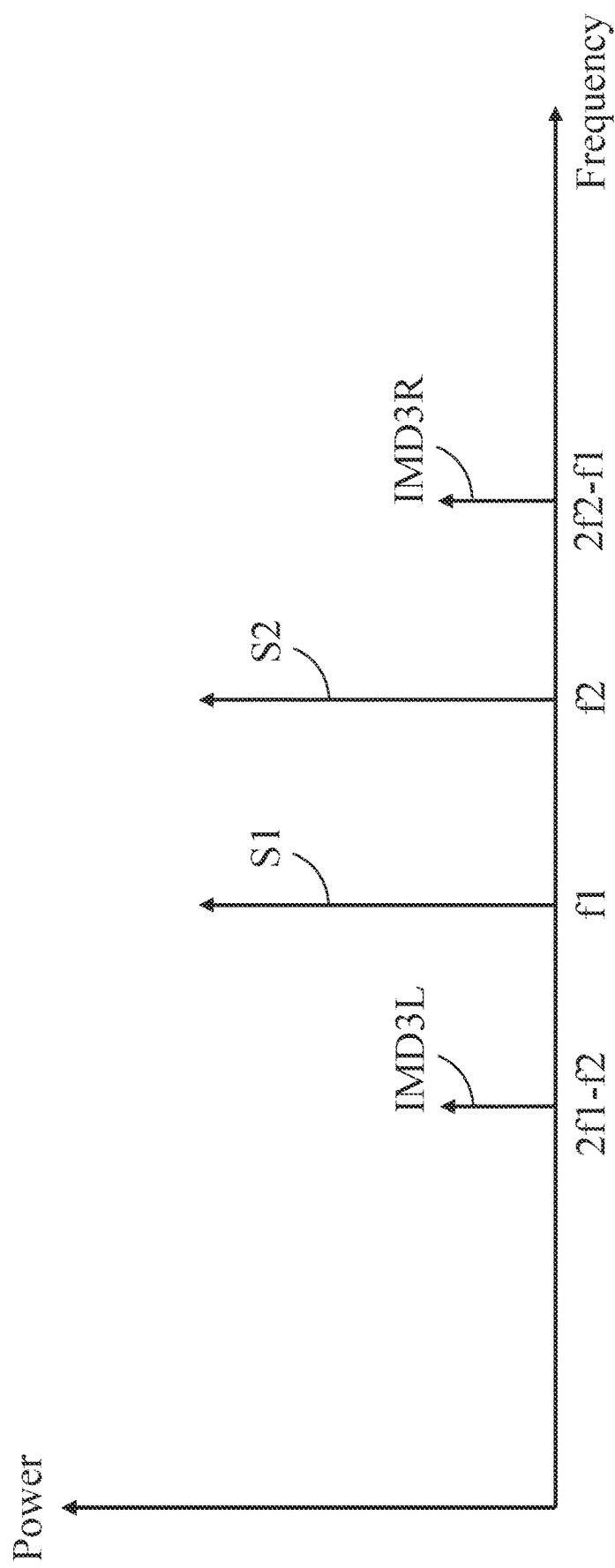
FIG. 3 is a schematic diagram illustrating a main signal S1 and a main signal S2 in the spectrum after passing through a power amplifier.

When the input terminal of the power amplifier 102 receives a main signal S1 (having a frequency of f1 and a power of P1, as shown in FIG. 2) and a main signal S2 (having a frequency of f2 and a power of P2), the output terminal of the power amplifier 102 obtains the main signal S1 (having a frequency of f1 and a power of P1*G, as shown in FIG. 3) and the main signal S2 (having a frequency of f2 and a power of P2*G), wherein G is a gain of the power amplifier 102. Meanwhile, an IMD3 signal IMD3L having a power of P3 is generated at the frequency of 2f1-f2, and an IMD3 signal IMD3R having a power P4 is generated at the frequency of 2f2-f1. It should be noted that, in the present disclosure, only the IMD3 signals IMD3L and IMD3R, which have the greatest impact, are discussed, and the other IMD signals are ignored.

The spectrum analyzer 104 can easily know the power of the signal IMD3L and the signal IMD3R, but it cannot know the phase information of the signal IMD3L and the signal IMD3R. When the power amplifier 102 is integrated into the communication system, it may be necessary to know the relationship between the phase of the input signal of the power amplifier 102 and the phase of the IMD3 signal outputted from the power amplifier 102 for system calibration. Therefore, the purpose of the present disclosure is to estimate the phase of the signal IMD3L and the phase of the signal IMD3R when designing the power amplifier 102, i.e., before the power amplifier 102 is integrated into the communication system.

Figure 4:
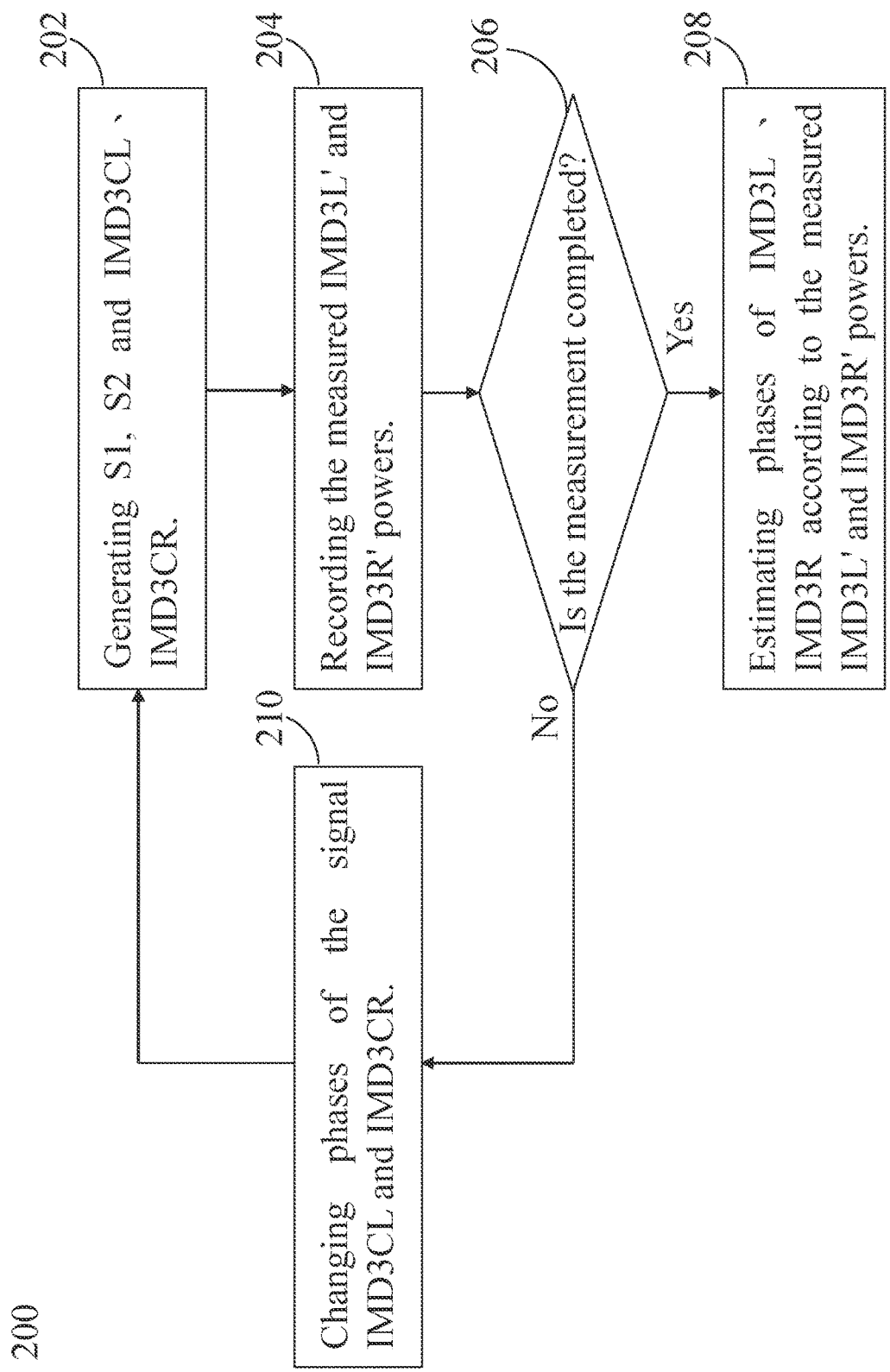
FIG. 4 is a flowchart illustrating a measuring method according to the first embodiment of the present disclosure.

Reference is also made to the flowchart of FIG. 4, which illustrates a measuring method 200 according to the first embodiment of the present disclosure. The Steps 202 to 210 are phase estimation processes and include multiple times of sub-processes (steps 202, 204, 206, 210 as a whole are one sub-process). In the Step 202, the controller 106 controls the signal generator 108 to generate the main signal S1, the main signal S2, the adjustable signal IMD3CL, and the adjustable signal IMD3CR at the input of the power amplifier 102, where the frequencies of the main signal S1, the main signal S2, the adjustable signal IMD3CL, and the adjustable signal IMD3CR are f1, f2, 2f1-f2, 2f2-f1, and 2f1-f1, respectively. Next, in the Step 204, the controller 106 controls the spectrum analyzer 104 to correspondingly measure the power at 2f1-f2 and the power at 2f2-f1 at the output of the power amplifier 102 and record them.

Since the frequencies of the adjustable signal IMD3CL and the adjustable signal IMD3CR are at 2f1-f2 and 2f2-f1, respectively, the powers of the IMD3 signal IMD3L and the IMD3R of FIG. 3 will be affected. Specifically, if the phase difference between the adjustable signal IMD3CL and the IMD3 signal IMD3L of FIG. 3 is 0°, then the power of the adjustable signal IMD3CL will be completely positively added to the IMD3 signal IMD3L of FIG. 3; conversely, if the phase difference between the adjustable signal IMD3CL and the IMD3 signal IMD3L of FIG. 3 is 180°, the power of the adjustable signal IMD3CL will be completely reversed and added to the IMD3 signal IMD3L of FIG. 3. The relationship between the adjustable signal IMD3CR and the IMD3 signal IMD3R is also the same, and the details will not be repeated.

Hence, in the present disclosure, in multiple times of sub-processes, the phases of the adjustable signal IMD3CL and the adjustable signal IMD3CR are respectively set to different values, and the power at the frequency 2f1-f2 and the power at the frequency 2f2-f1 are obtained. In the present embodiment, the phases of the adjustable signal IMD3CLs of the sub-processes are equally distributed between 0° and 360°, and the phases of the adjustable signal IMD3CRs of the sub-processes are also equally distributed between 0° and 360° between. For example, a total of 100 sub-operations are performed, and 360° is divided into 100 phases, namely 0°, 3.6°, 7.2°, . . . , 356.4° are used as the phases of the adjustable signals IMD3CL and IMD3CR in each sub-process.

In the Step 206, the controller 106 determines whether a predetermined times of sub-process has been completed, if not, then the phases of the adjustable signal IMD3CL and the adjustable signal IMD3CR are set to different values and the sub-process is performed again; if yes, then the method proceeds to the Step 208. In the Step 208, the phases of the IMD3 signal IMD3L and IMD3L are estimated based on a plurality of powers obtained at the frequency of 2f1-f2 and on a plurality of powers obtained at the frequency of 2f2-f1 during the plurality of sub-processes.

Figure 6:
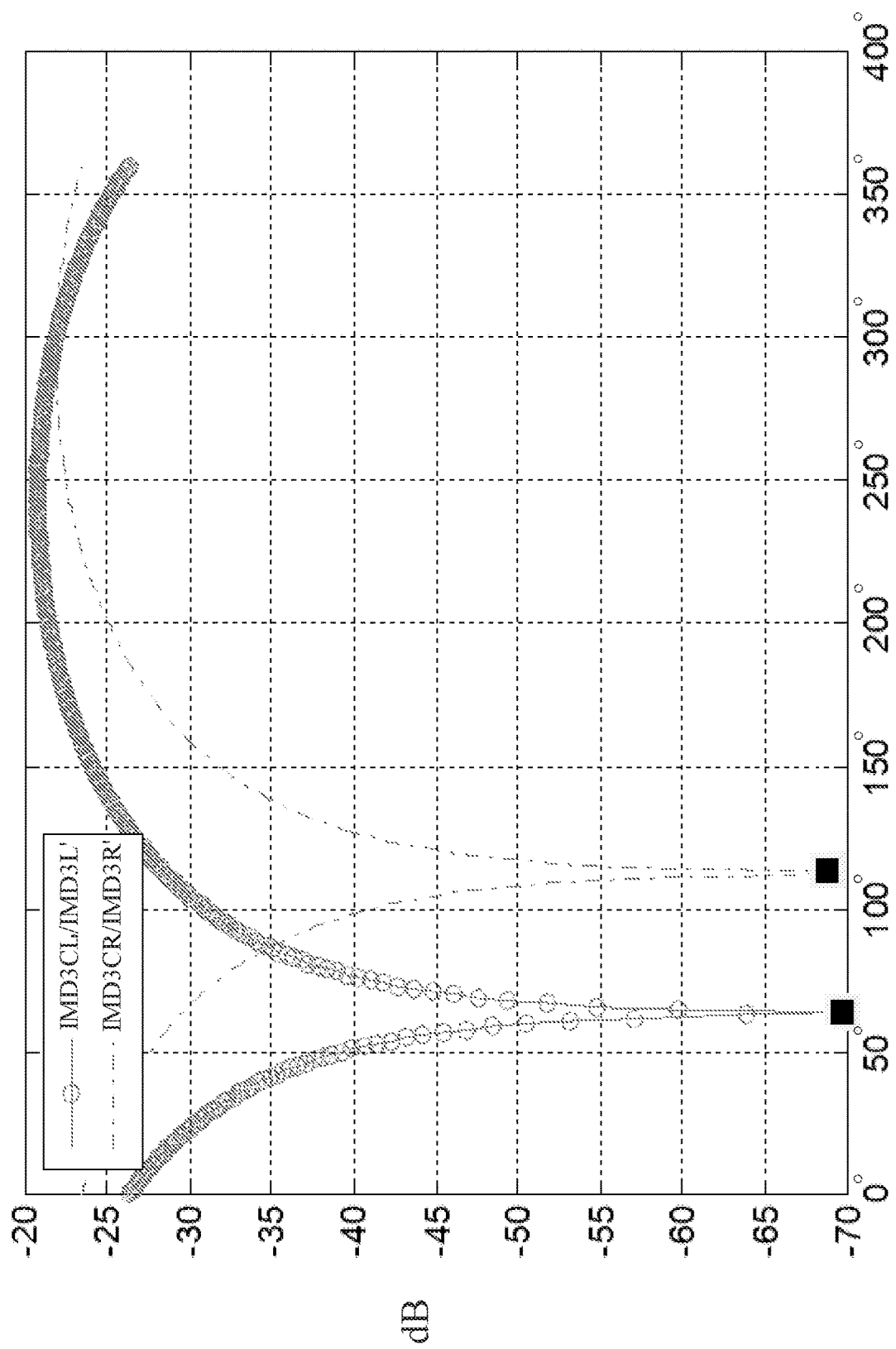
FIG. 6 illustrates the power of the IMD3 signal IMD3L and the IMD3 signal IMD3R obtained from the adjustable signal IMD3CL and the adjustable signal IMD3CR in different phases.

For example, the information recorded by the controller 106 is shown in FIG. 6, where for the line with circles, the corresponding horizontal axis is the phase of the adjustable signal IMD3CL applied to the input terminal of the power amplifier 102, and the corresponding vertical axis is the power measured at the output terminal of the power amplifier 102 at frequencies 2f1-f2; for the dashed line, the corresponding horizontal axis is the phase of the adjustable signal IMD3CR applied to the input terminal of the power amplifier 102, and the corresponding vertical axis is the power at the frequency 2f2-f1 measured at the output terminal of the power amplifier 102. Hence, the phase (approximately 240°) corresponding to the highest point of the line with circles can be used as the phase estimation value of the IMD3 signal IMD3L of FIG. 3; and the phase (approximately 270°) corresponding to the highest point of the dashed line can be used as the phase estimation value of the IMD3 signal IMD3R of FIG. 3. Alternatively, the inverted phase (about 240°) of the phase (about 60°) corresponding to the lowest point of the line with circles can be used as the phase estimation value of the IMD3 signal IMD3L of FIG. 3; and the inverted phase (approximately 270°) of the phase (approximately 110°) corresponding to the lowest point of the dashed line can be used as the phase estimation value of the IMD3 signal IMD3R of FIG. 3.

In the present embodiment, the phase estimation is performed on both the IMD3 signals IMD3L and IMD3R of FIG. 3, but in certain embodiments, the phase estimation may be performed only on the IMD3 signal IMD3L or the IMD3 signal IMD3R of FIG. 3.

Figure 5:
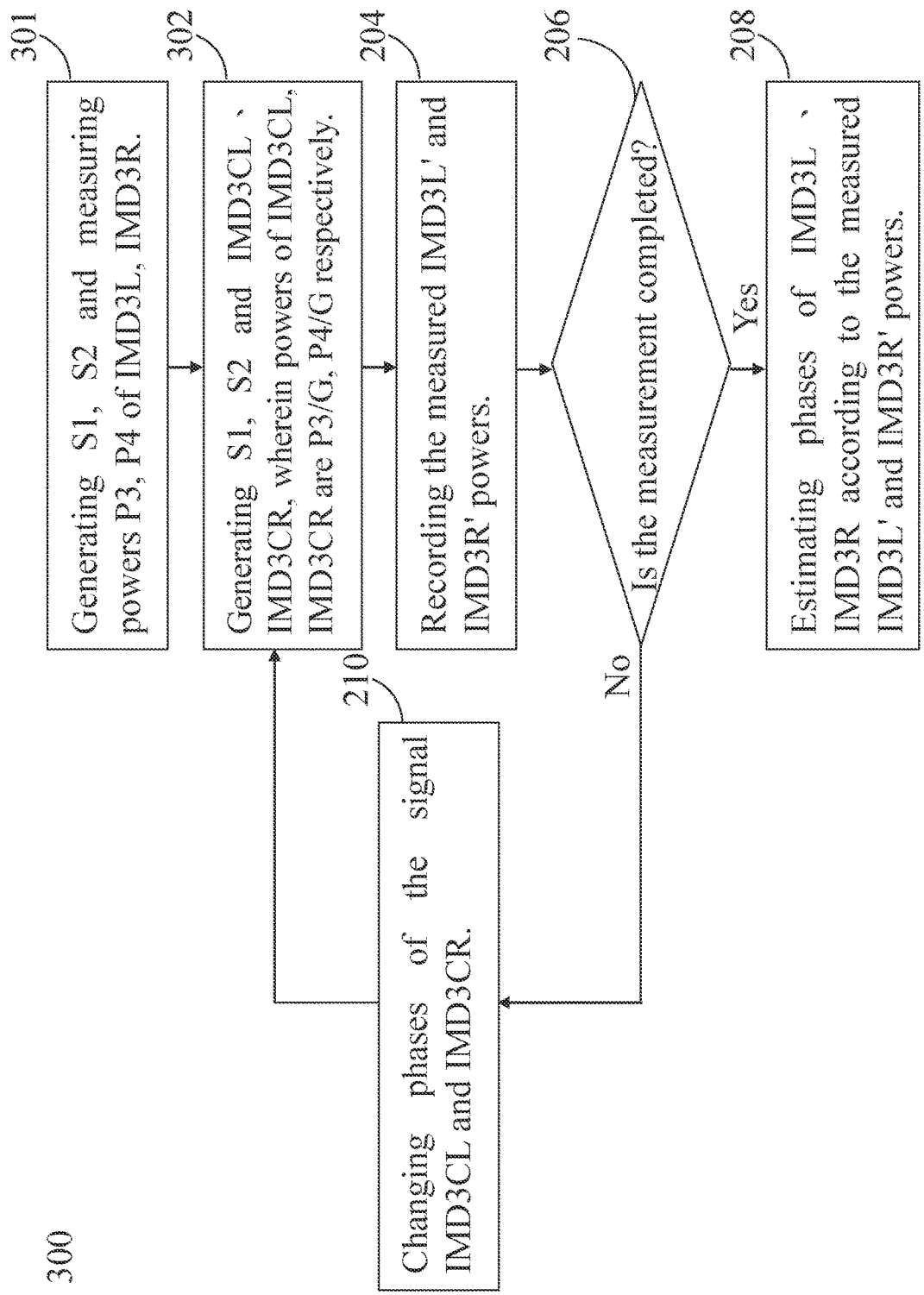
FIG. 5 is a flowchart illustrating a measuring method according to the second embodiment of the present disclosure.

FIG. 5 is a flowchart illustrating a measuring method 300 according to the second embodiment of the present disclosure. The difference between the measuring method 300 and the measuring method 200 is that the measuring method 300 first measures the powers P3 and P4 of the IMD3 signals IMD3L and IMD3R of FIG. 3 in Step 301. Next, the Step 302 of the measuring method 300 is similar to step 202 of the measuring method 200, except that the powers of the adjustable signal IMD3CL and the adjustable signal IMD3CR are specifically set to P3/G and P4/G. In this way, the power of the adjustable signal IMD3CL after passing through the power amplifier 102 will be the same as that of the IMD3 signal IMD3L. When the phase of the adjustable signal IMD3CL and the phase of the IMD3 signal IMD3L are opposite, they can completely cancel each other, so that the power measured at the frequency of 2f1-f2 by the spectrum analyzer 104 at the output terminal of the power amplifier 102 is 0. Therefore, it is more convenient for the controller 106 to determine the minimum power in the Step 208. The relationship between the adjustable signal IMD3CR and the IMD3 signal IMD3R is also the same, and the details will not be repeated.

The foregoing description briefly sets forth the features of certain embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:

1. A measuring system, configured to measure a phase of an IMD3 signal generated by a power amplifier, the system comprising:
   a signal generator, coupled to an input terminal of the power amplifier;
   a spectrum analyzer, coupled to an output terminal of the power amplifier; and
   a controller, configured to perform phases estimation process, including a plurality of sub-processes, wherein each sub-process comprises:
      controlling the signal generator to generate a first main signal, a second main signal, a first adjustable signal, wherein a frequency of each of the first main signal, the second main signal, the first adjustable signal is f1, f2, and 2f1-f2; and
      controlling the spectrum analyzer to correspondingly measure a first power at the frequency of 2f1-f2;
   wherein the power of the first adjustable signal in each sub-process is the same as that in any other sub-processes, but the phase of the first adjustable signal in each sub-process is different from that of any other sub-processes, the phase and power of the first main signal in each sub-process are the same as that in any other sub-processes, the phase and power of the second main signal in each sub-process are the same as that in any other sub-processes, and the controller estimates the phase of the IMD3 signal generated at the frequency of 2f1-f2 by the first main signal and the second main signal passing through the power amplifier based on a plurality of first powers obtained by the plurality of sub-processes.

2. The system of claim 1, wherein the controller uses an inverted phase of a phase of the first adjustable signal corresponding to the minimum of the plurality of first powers obtained by the plurality of sub-processes as an estimation result of the phase of the IMD3 signal generated at the frequency of 2f1-f2 by the first main signal and the second main signal passing through the power amplifier.

3. The system of claim 1, wherein phases of the first adjustable signals of the sub-processes are equally distributed between 0° and 360°.

4. The system of claim 1, wherein each sub-process further comprises:
   controlling the signal generator to generate a second adjustable signal, wherein a frequency of the second adjustable signal is 2f2-f1; and
   controlling the spectrum analyzer to correspondingly measure a second power of the frequency of 2f2-f1;
   wherein a power of the second adjustable signal in each sub-process is the same as that in any other sub-processes, but the phase of the second adjustable signal in each sub-process is different from that of any other sub-processes, the controller estimates the phase of the IMD3 signal generated at the frequency of 2f2-f1 by the first main signal and the second main signal passing through the power amplifier based on a plurality of second powers obtained by the plurality of sub-processes.

5. The system of claim 4, wherein the controller uses an inverted phase of a phase of the second adjustable signal corresponding to the minimum of the plurality of second powers obtained by the plurality of sub-processes as an estimation result of the phase of the IMD3 signal generated at the frequency of 2f2-f1 by the first main signal and the second main signal passing through the power amplifier.

6. The system of claim 4, wherein phases of the second adjustable signals of the sub-processes are equally distributed between 0° and 360°.

7. The system of claim 1, wherein the controller further performs a power estimation process before performing the phases estimation process, wherein in the power estimation process, the controller controls the signal generator to generate the first main signal and the second main signal, and measures a third power at the frequency of 2f1-f2.

8. The system of claim 7, wherein the power of the first adjustable signal is the quotient of dividing the third power by a gain of the power amplifier.

9. The system of claim 4, wherein the controller further performs a power estimation process before performing the phases estimation process, wherein in the power estimation process, the controller controls the signal generator to generate the first main signal and the second main signal, and measures a fourth power at the frequency of 2f2-f1.

10. The system of claim 9, wherein the power of the second adjustable signal is the quotient of dividing the fourth power by a gain of the power amplifier.

11. A measuring method, configured to measure a phase of an IMD3 signal generated by a power amplifier, the method comprising:
   performing a phases estimation process, comprising a plurality of sub-processes, wherein each sub-process comprises:
      generating a first main signal, a second main signal, a first adjustable signal, wherein a frequency of each of the first main signal, the second main signal, the first adjustable signal is f1, f2, and 2f1-f2; and
      correspondingly measuring a first power at the frequency of 2f1-f2; and
   estimating the phase of the IMD3 signal generated at the frequency of 2f1-f2 by the first main signal and the second main signal passing through the power amplifier based on a plurality of first powers obtained by the plurality of sub-processes;
   wherein a power of the first adjustable signal in each sub-process is the same as that in any other sub-processes, but the phase of the first adjustable signal in each sub-process is different from that of any other sub-processes, the phase and power of the first main signal in each sub-process are the same as that in any other sub-processes, and the phase and power of the second main signal in each sub-process are the same as that in any other sub-processes.

12. The method of claim 11, wherein the step of estimating the phase of the IMD3 signal at the frequency of 2f1-f2 comprises:
   using an inverted phase of a phase of the first adjustable signal corresponding to the minimum of the plurality of first powers obtained by the plurality of sub-processes as an estimation result of the phase of the IMD3 signal generated at the frequency of 2f1-f2 by the first main signal and the second main signal passing through the power amplifier.

13. The method of claim 11, wherein phases of the first adjustable signals of the sub-processes are equally distributed between 0° and 360°.

14. The method of claim 11, wherein each sub-process further comprises:

generating a second adjustable signal, wherein a frequency of the second adjustable signal is 2f2-f1; and correspondingly measuring a second power at the frequency of 2f2-f1; and the method further comprises:

estimating the phase of the IMD3 signal generated at the frequency of 2f2-f1 by the first main signal and the second main signal passing through the power amplifier based on a plurality of second powers obtained by the plurality of sub-processes;

wherein a power of the second adjustable signal of each sub-process is the same as that of any other sub-processes, but the phase of the second adjustable signal of each sub-process is different from that of any other sub-processes.

15. The method of claim 14, wherein the step of estimating the phase of the IMD3 signal at the frequency of 2f2-f1 comprises:

using an inverted phase of a phase of the second adjustable signal corresponding to the minimum of the plurality of second powers obtained by the plurality of sub-processes as an estimation result of the phase of the IMD3 signal generated at the frequency of 2f2-f1 by the first main signal and the second main signal passing through the power amplifier.

16. The method of claim 14, wherein phases of the second adjustable signals of the sub-processes are equally distributed between 0° and 360°.

17. The method of claim 11, further comprising:

performing a power estimation process before performing the phases estimation process, wherein the power estimation process comprises:

generating the first main signal and the second main signal, and measuring a third power at the frequency of 2f1-f2.

18. The method of claim 17, wherein the power of the first adjustable signal is the quotient of dividing the third power by a gain of the power amplifier.

19. The method of claim 14, further comprising:

performing a power estimation process before performing the phases estimation process, wherein power estimation process comprises:

generating the first main signal and the second main signal, and measuring a fourth power at the frequency of 2f2-f1.

20. The method of claim 19, wherein the power of the second adjustable signal is the quotient of dividing the fourth power by a gain of the power amplifier.

* * * * *